US007019879B2

(12) United States Patent
Schroeder

(10) Patent No.: US 7,019,879 B2
(45) Date of Patent: Mar. 28, 2006

(54) ANGLED STROBE LINES FOR HIGH ASPECT RATIO SPATIAL LIGHT MODULATOR

(76) Inventor: Dale W. Schroeder, 1555 Tucker Rd., Scotts Valley, CA (US) 95066

( * ) Notice: Subject to any disclaimer, the term of this patent is extended or adjusted under 35 U.S.C. 154(b) by 0 days.

(21) Appl. No.: 10/810,414

(22) Filed: Mar. 26, 2004

(65) Prior Publication Data

US 2005/0213179 A1 Sep. 29, 2005

(51) Int. Cl.
*G02F 1/00* (2006.01)
*G02F 1/03* (2006.01)
*G09G 3/30* (2006.01)
*G03B 27/54* (2006.01)

(52) U.S. Cl. ........................ 359/237; 359/254; 345/81; 355/67

(58) Field of Classification Search ................ 359/237, 359/239, 245, 254, 259, 292, 295, 320; 345/36–46, 345/76, 75.2, 81, 82, 84–87, 96–100; 355/53, 355/67, 77
See application file for complete search history.

(56) References Cited

U.S. PATENT DOCUMENTS 6,281,866 B1 * 8/2001 Robinson et al. ............. 345/87
2005/0212722 A1 * 9/2005 Schroeder .................... 345/44

* cited by examiner

*Primary Examiner*—Georgia Epps
*Assistant Examiner*—Jack Dinh

(57) ABSTRACT

An electronic circuit that can be used, for example, in a spatial light modulator to photolithographically transfer an image onto a substrate, includes angled strobe lines electrically coupled to respective sets of circuit elements within an array of circuit elements. Each set of circuit elements includes at least two circuit elements positioned diagonally adjacent one another in the array. The circuit elements are alterable in response to data stored therein. The strobe lines provide strobe signals to the circuit elements to shift the data between the circuit elements.

22 Claims, 6 Drawing Sheets

FIG. 4A
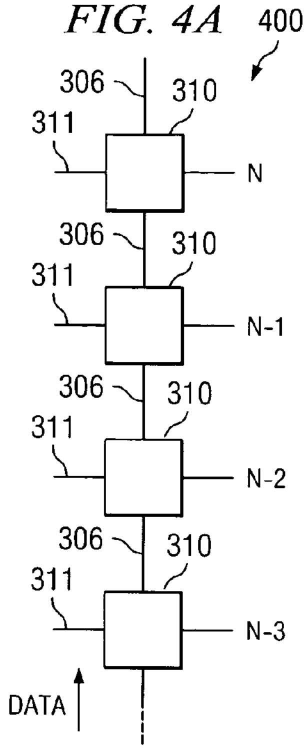
FIG. 3
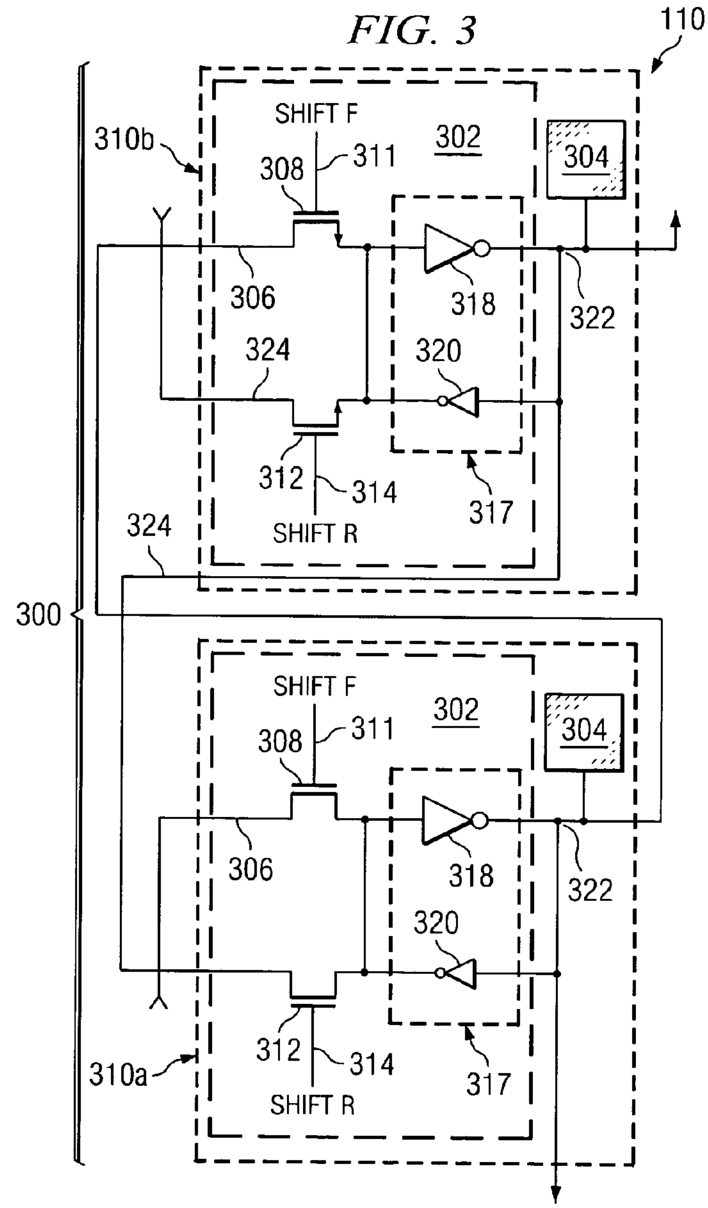
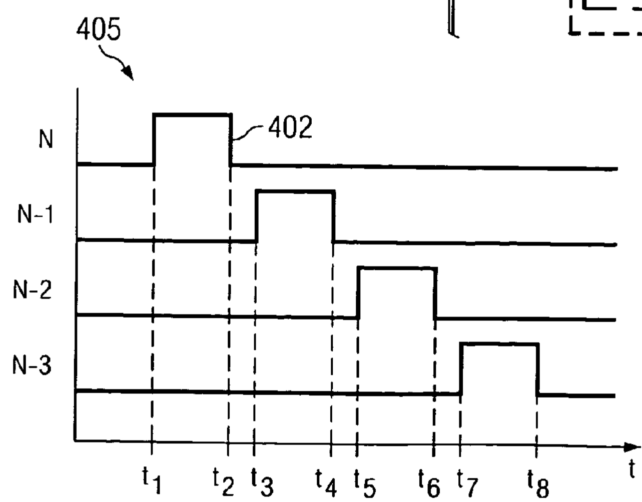
FIG. 4B

ANGLED STROBE LINES FOR HIGH ASPECT RATIO SPATIAL LIGHT MODULATOR

CROSS-REFERENCE TO RELATED APPLICATIONS

This application is related by subject matter to U.S. Utility applications Ser. No. 10/810,067 for Patent entitled BUFFERS FOR LIGHT MODULATION ELEMENTS IN SPATIAL LIGHT MODULATORS; and Ser. No. 10/811,407, entitled SPATIAL LIGHT MODULATOR AND METHOD FOR INTERLEAVING DATA, each filed on an even date herewith.

BACKGROUND OF THE INVENTION

1. Technical Field of the Invention

The present invention relates generally to photolithography, and more specifically, to dynamic photolithography systems.

2. Description of Related Art

Recently, dynamic photolithography systems have been developed that employ a spatial light modulator (SLM) to define a pattern that is imaged onto a substrate having a photosensitive surface, such as a layer of photoresist. SLMs are electrical devices that include individually controllable light modulation elements (e.g., liquid crystal cells or micromirrors) that define pixels of an image in response to electrical signals. Typically, at small feature sizes (e.g., 5 μm or smaller), there are tens of millions of light modulation elements within an SLM that is not more than a few square centimeters in area. For example, an SLM including an array of 16,384 columns by 606 rows of 3 μm light modulation elements has been proposed for use in transferring such small feature sizes.

With the small SLM size, multiple exposures are generally required to image the entire area of the substrate. Since the image formed by the SLM is easily reconfigurable, it is a relatively simple process to divide the final image into sections, configure the SLM to transfer one of the image sections onto the appropriate area of the substrate surface, shift the relative position of the substrate and SLM and repeat the process for each image section until the entire image is transferred onto the substrate surface.

However, with the large number of light modulation elements, it is impracticable to assume that the SLM will be free from defects. Statistically, there will be at least a few of the tens of millions of light modulation elements of the SLM that are defective. As a result of the multiple imaging process, each defective light modulation element produces N pixel defects on the substrate surface, where N is the number of sections the image is divided into. To limit the number of defects in the transferred image caused by defective light modulation elements, the data can be shifted through the SLM to transfer each image section onto the same portion of the substrate multiple times using different light modulation elements in the SLM, as described in co-pending and commonly assigned U.S. application for patent Ser. No. 10/737,126.

Strobe lines within the SLM provide strobe signals to the light modulation elements to drive the data shifting between the light modulation elements. However, due to the small size and the high aspect ratio (length to width) of SLMs, circuit loading and strobe line resistance limit the strobe frequencies to unacceptably low values, while also introducing significant clock skew across the SLM. In addition, when the strobe lines are configured to run the length of the SLM, failure points or shorts in the strobe lines can render the entire SLM unusable by preventing data shifting through the SLM. Therefore, what is needed is a strobe mechanism to increase the operational frequency of the strobe lines, reduce clock skew and limit damage from strobe line failure in SLMs.

SUMMARY OF THE INVENTION

Embodiments of the present invention provide an electronic circuit that can be used in a spatial light modulator, for example. The electronic circuit includes circuit elements arranged in an array. The circuit elements are alterable in response to data stored therein, and are configured to shift data between the circuit elements. A strobe line is electrically coupled to a set of the circuit elements arranged such that at least two of the circuit elements in the set are positioned diagonally adjacent one another in the array. The strobe line provides a strobe signal to the set of light modulation elements to cause the data to be shifted to circuit elements outside of the set.

In one embodiment, the strobe line is alternately electrically coupled to orthogonally-adjacent and diagonally-adjacent circuit elements. For example, the strobe line can be electrically coupled to circuit elements in an alternating pattern of two horizontally-adjacent circuit elements and two diagonally-adjacent circuit elements to reduce the number of strobe lines compared with a purely diagonal arrangement, while maintaining the benefits of shorter strobe lines.

Other embodiments of the present invention provide a process for performing photolithography using an array of light modulation elements. The array includes strobe lines electrically coupled to respective sets of the light modulation elements. At least one of the sets includes light modulation elements that are positioned diagonally adjacent one another in the array. Data representing an image is loaded into the array. Certain ones of the light modulation elements are altered in response to the data loaded into the light modulation elements to transfer an instance of the image onto a substrate. Strobe signals are applied to the strobe lines to shift the data between the light modulation elements. Additional ones of the light modulation elements are altered in response to the shifted data to transfer another instance of the image onto the substrate.

Extending the strobe lines generally diagonally across the light modulation element array reduces the length of the strobe lines. This allows the operational frequency of the spatial light modulator to be increased by about three orders of magnitude (×1000) and reduces clock skew. In addition, extending the strobe lines generally diagonally results in strobe lines running across only a portion of the total width of the spatial light modulator, which limits the extent of damage resulting from strobe line failure to a smaller portion of the array. Furthermore, the invention provides embodiments with other features and advantages in addition to or in lieu of those discussed above. Many of these features and advantages are apparent from the description below with reference to the following drawings.

BRIEF DESCRIPTION OF THE DRAWINGS

The disclosed invention will be described with reference to the accompanying drawings, which show sample embodiments of the invention and which are incorporated in the specification hereof by reference, wherein:

FIG. 3 is a schematic of an exemplary spatial light modulator for shifting data through the spatial light modulator, in accordance with embodiments of the present invention;

FIG. 4A is a block diagram illustrating an exemplary interconnection of light modulation elements within the spatial light modulator of FIG. 3;

FIG. 4B is a timing diagram for shifting data between the light modulation elements;

DETAILED DESCRIPTION OF EXEMPLARY EMBODIMENTS

Figure 1:
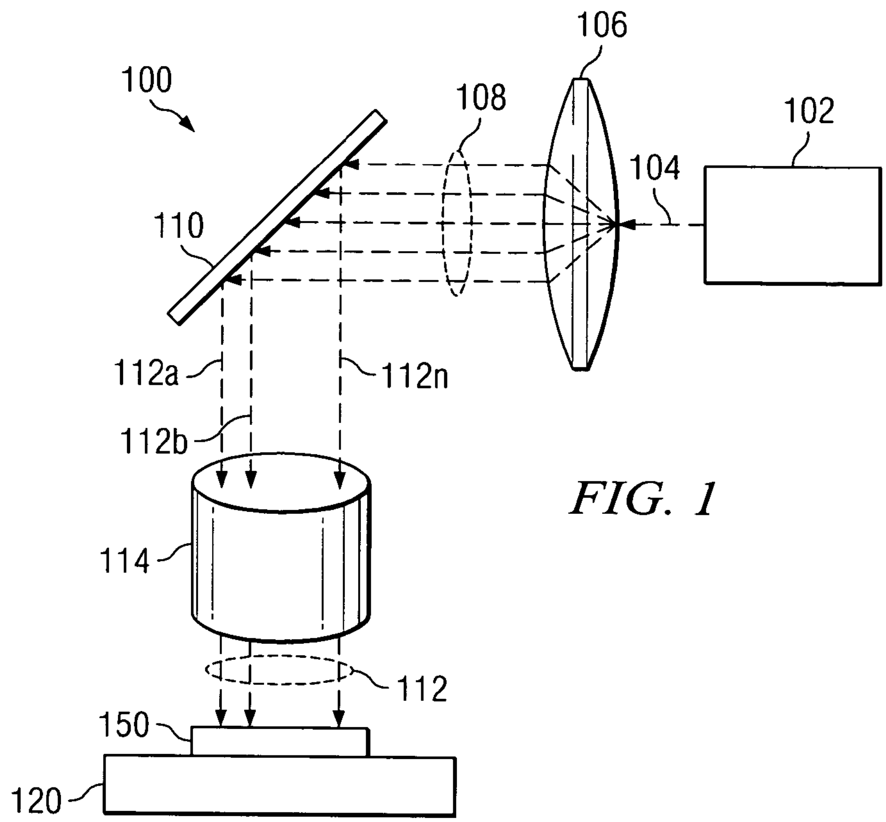
FIG. 1 illustrates a photolithography system utilizing a spatial light modulator to photolithographically transfer an image to a substrate in accordance with embodiments of the present invention.

FIG. 1 illustrates a dynamic photolithography system 100 for photolithographically transferring an image to a substrate 150. The photolithography system 100 includes a light source 102 operable to output light 104. The light source 102 can be a laser, such as an excimer laser, or other non-laser source, as understood in the art. The light source 102 is optically coupled to beam shaping optics 106. The output of the beam shaping optics 106 is light 108 that is directed toward a spatial light modulator 110 in accordance with embodiments of the invention. The spatial light modulator 110 includes light modulation elements (not shown) operable to selectively transfer the light 108. The light modulation elements are described in more detail below in connection with FIG. 3. In one embodiment, the light modulation elements are liquid crystal elements. However, it should be understood that in other embodiments, the light modulation elements are micromirrors or another type of optical device that can selectively transfer light by reflection, transmission or otherwise.

The output of the spatial light modulator 110 includes dark areas with no light and light areas made up of multiple light beams 112*a*–112*n* (collectively 112) that are transferred by selected light modulation elements to form at least a portion of an image containing a pattern. The light beams 112 are directed to projection optics 114, which is optically aligned to direct the light beams 112 onto the substrate 150. A photosensitive layer (not shown), such as a layer of photoresist, is on the surface of the substrate 150. The photosensitive layer reacts in response to the light beams 112 to produce the pattern on the surface of the substrate 150. In one embodiment, the substrate 150 is mounted on a scanning stage 120 to move the substrate 150 in any direction relative to the spatial light modulator 110. The scanning stage 120 can be, for example, a high precision scanning stage. In another embodiment, the substrate 150 remains stationary and the optics and/or light beams 112 move relative to the substrate 150. In either configuration, one of the substrate 150 and the spatial light modulator 110 is moved relative to the other to transfer the image onto the substrate 150.

The spatial light modulator 110 further includes pixel drive circuits (not shown) that are uniquely coupled to the light modulation elements. The pixel drive circuits are described in more detail below in connection with FIG. 3. The pixel drive circuits store data that define the state of the light modulation elements. For example, light modulation elements that are reflective can be selectively altered to be in a reflective or non-reflective state such that the received light 108 is either reflected or not reflected onto the substrate 150 by storing data (e.g., logical LOW and HIGH data values) in pixel drive circuits associated with the light modulation elements. In effect, the spatial light modulator 110 operates as a dynamic mask that forms a pattern that is imaged onto the photosensitive layer of the substrate 150.

Figure 2:
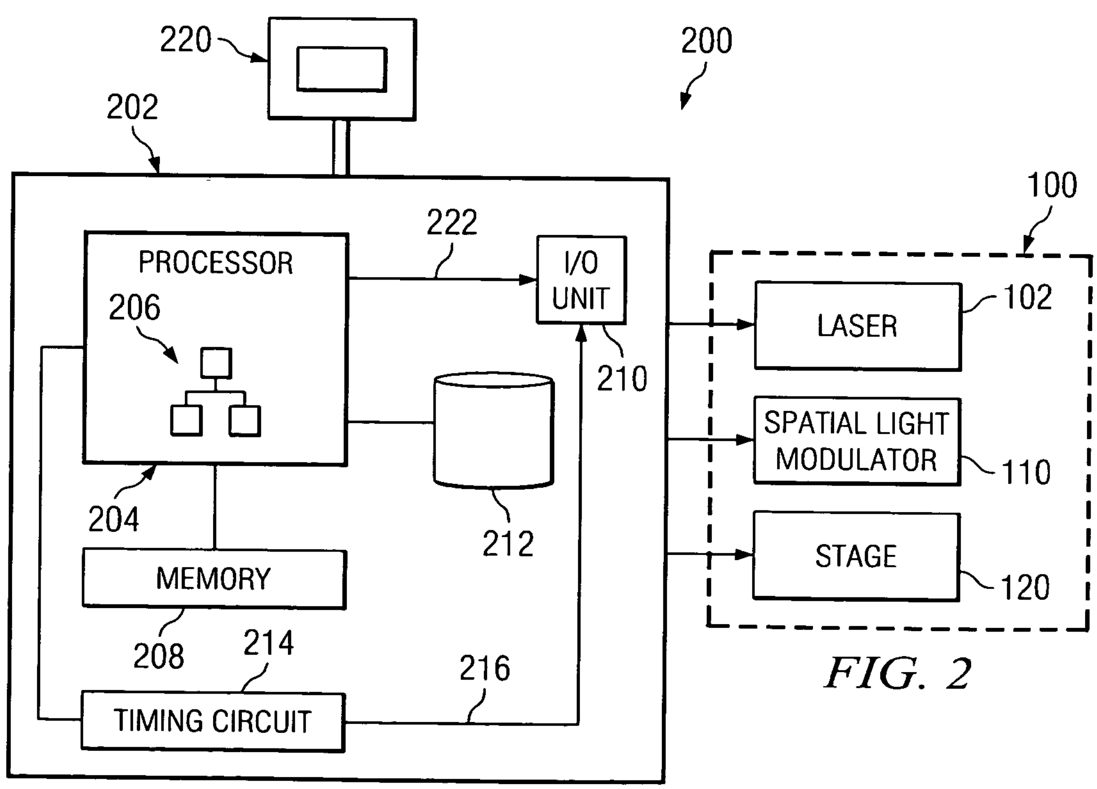
FIG. 2 is a block diagram illustrating a computing system operable to control the photolithography system of FIG. 1.

FIG. 2 is a block diagram illustrating the configuration 200 of a computing system 202 operable to control the photolithography system 100 of FIG. 1. The computing system 202 includes a processing unit 204 operable to execute software 206. The processing unit 204 can be any type of microprocessor, microcontroller, programmable logic device, digital signal processor or other processing device. The processing unit 204 is coupled to a memory unit 208 and input/output (I/O) unit 210. The I/O unit 210 can be wired or wireless. The processing unit 204 is further coupled to a storage unit 212 and timing circuit 214 that generates timing signals 216 for the photolithography system 100. An electronic display 220 is optionally coupled to the computing system 202 and operable to display an image (or portion of an image) that is to be communicated to the spatial light modulator 110 for imaging onto the substrate 150 of FIG. 1.

The timing signals 216 control the operation of the stage 120, spatial light modulator 110 and laser 102 during exposure cycles. Examples of timing signals 216 include data clock signals to sequentially clock data 222 representing a portion of an image into the spatial light modulator 110, strobe signals provided along strobe lines within the spatial light modulator 110 to shift data between light modulation elements of the spatial light modulator 110, exposure signals to initiate a flash of the laser 102, and other clock signals to drive the spatial light modulator 110, laser 102 and stage 120. The processor 204 communicates with the timing circuit 214 and I/O unit 210 to communicate the data 222 and timing signals 216 to the spatial light modulator 110 and other components of the photolithography system 100, such as the laser 102 and stage 120. For example, during an exposure cycle, data 222 is shifted between light modulation elements within the spatial light modulator 110 by strobe signals, data 222 is transmitted from the computing system 202 to the spatial light modulator 110 in response to a data clock signal and the other clock signals drive the SLM 110, stage 120 and laser 102 to alter the state of light modulation elements within the SLM 110 as a function of the data 222, to align the stage 120 with the SLM 110 for image transfer and to control the timing of the exposure signal to initiate the laser 102 flash.

To reduce defects in the transferred image due to light modulation element defects, the data 222 communicated to the SLM 110 during each exposure cycle includes only a portion of the image to enable optical oversampling of the image on the substrate. An example of an optical oversampling technique is described in co-pending and commonly assigned U.S. applications for patent Ser. Nos. 10/737,126 and 10/736,090, which are incorporated by reference herein.

In one embodiment, the image is divided into sections, with each section transferred by the SLM 110 during a single exposure cycle. In addition, each section is divided into subsections, such that the data 222 sent to the SLM 110 represents at least one of the image subsections. The data representing the remaining image subsections of a particular image section are shifted within the SLM 110 to enable the remaining image subsections to be imaged by different light modulation elements of the SLM 110.

For example, in one implementation embodiment, if each image section is divided into six image subsections, the data 222 includes data previously transferred to the substrate that represents five image subsections and data representing one new image subsection. However, with potentially tens of millions of light modulation elements, writing the data 222 representing all of the image subsections to the SLM 110 during each exposure cycle requires a large amount of data 222 to be communicated between the I/O unit 810 and the SLM 110. Such a large I/O bandwidth increases the power consumption and limits the throughput speed of the photolithography system 100. Therefore, in other implementation embodiments, the data 222 communicated to the SLM 110 during each exposure cycle includes only that representing the new image subsection(s) and not that representing any of the previously transferred image subsections in order to reduce bandwidth, thereby reducing power consumption and increasing throughput speed. The data representing the image subsections previously transferred to the substrate are stored within the SLM 110 and moved internally within the SLM 110.

FIG. 3 is a schematic of a portion of an exemplary spatial light modulator 110 capable of moving data internally during a photolithographic process. The SLM includes an array 300 of circuit elements, hereinafter referred to as light modulation elements 310*a* and 310*b* (collectively 310), each including a memory element 302 in communication with an associated pixel controller 304 that is at least partially responsible for controlling the state of a pixel defined by the light modulation element 310. In FIG. 3, each memory element 302 is a static memory element that includes an input line 306 and a forward access control element 308. In the example shown, the forward access control element 308 is a transistor having a forward access strobe line 311 that is operable to control the state of the forward access control element 308 during a shift forward operation. In FIG. 3, a shift forward operation shifts data up from light modulation element 310*a* to light modulation element 310*b*. Each memory element 302 further includes a reverse access control element 312 having a reverse access strobe line 314 operable to control the state of the reverse access control element 312 during a shift reverse operation. In FIG. 3, a shift reverse operation shifts data down from light modulation element 310*b* to light modulation element 310*a*.

Depending on the configuration of the array 300, light modulation elements 310*a* and 310*b* are either positioned in different columns of the same row or in different rows of the same column. Thus, the memory elements 302 are configured to shift data bi-directionally between adjacent rows or columns of the array 300. In addition, it should be understood that in other embodiments, the memory elements 302 can additionally or alternatively be configured to shift the data between non-adjacent rows, columns or light modulation elements 310 of the array 300.

A common node 316 of the forward and reverse access control elements 308 and 312, respectively, is coupled to a memory cell 317. In one embodiment, the memory cell 317 is a bi-stable circuit or static latch utilized to store data representing one pixel of the image. The memory cell 317 is shown implemented as a latch (i.e., a switch and back-to-back inverters) that uses a ripple clock to propagate data between memory cells 317. The ripple clock is described in more detail below with reference to FIGS. 4–7.

Each memory cell 317 includes a forward inverter 318 and a feedback inverter 320. The feedback inverter 320 is a "weak" feedback element that is utilized to reinforce the current state (i.e., LOW or HIGH state) to a stable position. Thus, if the common node 316 is in a low voltage level (i.e., a LOW state), the forward inverter 318 inverts the LOW state to a HIGH state on the output coupled to output node 322. The HIGH state on output node 322 is an input to the feedback inverter 320, which outputs a low voltage level onto node 316. The low voltage level output from the weak feedback inverter 320 reinforces, but does not control, the LOW state on node 316. Similarly, a high voltage level output from the weak feedback inverter 320 reinforces, but does not control, the HIGH state on node 316.

The output node 322 is coupled to the pixel controller 304 and is also the output node of the light modulation element 310. In one embodiment, the pixel controller 304 is a pixel electrode of a liquid crystal (LC) light modulation element. The voltage level on output node 322 is applied to the pixel electrode of the LC light modulation element to alter the state of the LC light modulation element when the voltage level applied to the pixel electrode differs from a voltage applied to a common electrode of the LC light modulation element. In other embodiments, the pixel controller 304 is an electromechanical device controlling the state or position of a micromirror.

Multiple light modulation elements 310 are electrically interconnected. In one embodiment, the light modulation elements 310 are connected in a shift register configuration, as shown in FIG. 3. In the shift register configuration, the output node 322 of a first light modulation element (e.g., light modulation element 310*a*) is connected to the input line 306 of a second light modulation element (e.g., light modulation element 310*b*). The output node 322 of the second light modulation element 310*b* is connected to the input line of a third light modulation element (not shown), and so on until the output node of the (N−1)th pixel (not shown) is connected to the input line 306 of the Nth pixel (not shown), thereby forming a forward connection network. To load input data into the forward connection network, the input data is provided at the input line 306 of the first light modulation element 310*a*, and data is shifted from the first light modulation element 310*a* to the second light modulation element 310*b* when a strobe signal is received on forward access strobe line 311 of light modulation element 310*a*, and so on. It should be understood that a similar data loading and shifting configuration can be implemented for a reverse connection network, where data is input to the last light modulation element 310 in the array 300.

FIG. 4A is a block diagram of an exemplary high-level shift register configuration 400 of the light modulation elements 310. The light modulation elements 310 have forward access strobe lines 311 coupled thereto for causing data on the input lines 306 to propagate through the memory elements 302 (shown in FIG. 3) in the forward direction. The light modulation elements 310 can be viewed as elements N, N−1, N−2, N−3, and so forth, where the Nth light modulation element 310 is the last light modulation element and the (N−3)rd light modulation element 310 is the first light modulation element. The shift register configuration 400 can cause data to propagate between adjacent and/or non-adjacent rows and/or columns of an array of light modulation elements 310.

FIG. 4B is a timing diagram 405 for shifting data between the light modulation elements in the shift register configuration 400 shown in FIG. 4A. As shown in FIG. 4B, a sequence of non-overlapping strobe signals, produced by a ripple clock or otherwise, is utilized to shift the data through the light modulation elements. As shown, a strobe signal 402 is applied to the forward access control element 308 of the Nth light modulation element via forward access strobe line 311 between times $t_1$ and $t_2$ to move data out of the Nth light modulation element. Each of the other strobe signals 402 for the memory elements of the (N−1)th, (N−2)th and (N−3)th light modulation elements are pulsed sequentially such that the data is moved serially from the (N−1)th light modulation element to the Nth light modulation element between times $t_3$ and $t_4$, from the (N−2)th light modulation element to the (N−1)th light modulation element between times $t_5$ and $t_6$ and from the (N−3)th light modulation element to the (N−2)th light modulation element between times $t_7$ and $t_8$ so as to ensure the data is preserved as it is shifted through the light modulation elements. It should be understood that a similar shifting mechanism can be used to shift data in a reverse sequence to enable bi-directional data movement.

Figure 5:
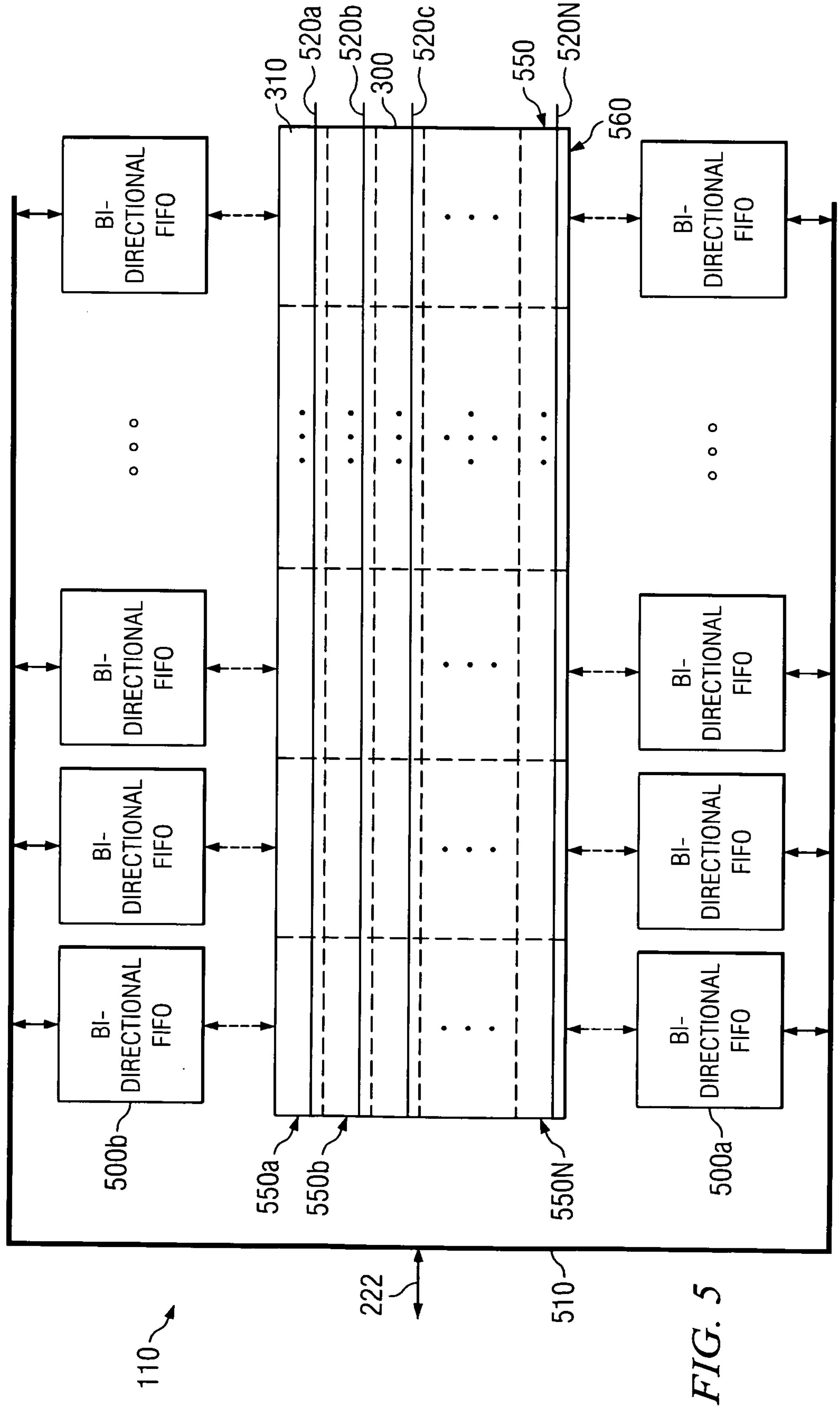
FIG. 5 is a block diagram of an exemplary configuration of the spatial light modulator.

FIG. 5 is a block diagram of an exemplary configuration of the spatial light modulator 110 of FIG. 3 with the light modulation elements 310 arranged in a shift register configuration similar to that shown in FIG. 4A. The array 300 of light modulation elements 310 is shown arranged in rows 550 and columns 560. There are more columns 560 than rows 550, resulting in a spatial light modulator 110 with a high aspect ratio. In the example shown in FIG. 5, the light modulation elements 310 are configured to shift data between rows 550 of the array 300. However, it should be understood that in other embodiments, the light modulation elements can be configured to shift data between columns 560 of the array 300.

In one embodiment, strobe lines 520*a*, 520*b* . . . 520N connected to forward access strobe lines 311 (shown in FIG. 3) of individual light modulation elements 310 run the length of the rows 550 to shift data between the rows 550. Thus, as a strobe signal is sent down each of the strobe lines, the data is shifted between rows 550. For example, assuming the data is shifted up in the array 300, at an initial time (e.g., $t_1$) a first strobe signal is sent down the strobe line 520*a* on row 550*a* of light modulation elements 310 to shift the data in row 550*a* of light modulation elements 310 out of the array 300. At a subsequent time (e.g., $t_2$), a second strobe signal is sent down the strobe line 520*b* on row 550*b* of the array 300 to shift the data from the light modulation elements 310 in row 550*b* to the light modulation elements 310 in row 550*a*. This process is continued until a strobe signal is sent down the strobe line 520N on row 550N of light modulation elements 310 to shift up the data in row 550N of light modulation elements 310.

In other embodiments, data 222 is input to the light modulation elements 310 via bus 510 and buffers 500*a* and 500*b* (collectively 500). Each buffer 500 is a bi-directional first-in-first-out (FIFO) buffer that stores and loads data 222 into the light modulation elements 310 associated with the buffer 500. In one embodiment, each buffer 500 loads data 222 into a single column 560 of the array 300. In another preferred embodiment, each buffer 500 loads data 222 into multiple columns 560 of the array 300. For example, after the data in the light modulation elements 310 in row 550N is shifted up, new data 222 is loaded into row 550N of light modulation elements 310 from buffers 500*a*. The data 222 output from the light modulation elements 310 in row 550*a* is additionally input to buffers 500*b*, which delay the data by a time corresponding to the time required to shift data from row 550N to row 550*a*. The data shifted out of row 550*a* can then be compared to the delayed original input data to determine if errors occurred during the data shifting and to identify potentially defective light modulation elements.

However, due to the small size and the high aspect ratio of the SLM 110, circuit loading and strobe line resistance limit the operating frequency, while also introducing significant clock skew across the SLM 110, i.e., along the strobe lines 520*a*–520N. In addition, failure points or shorts in the strobe lines that run the length of the rows 550 can render the entire SLM 110 unusable by preventing data shifting through the SLM 110.

Figure 6:
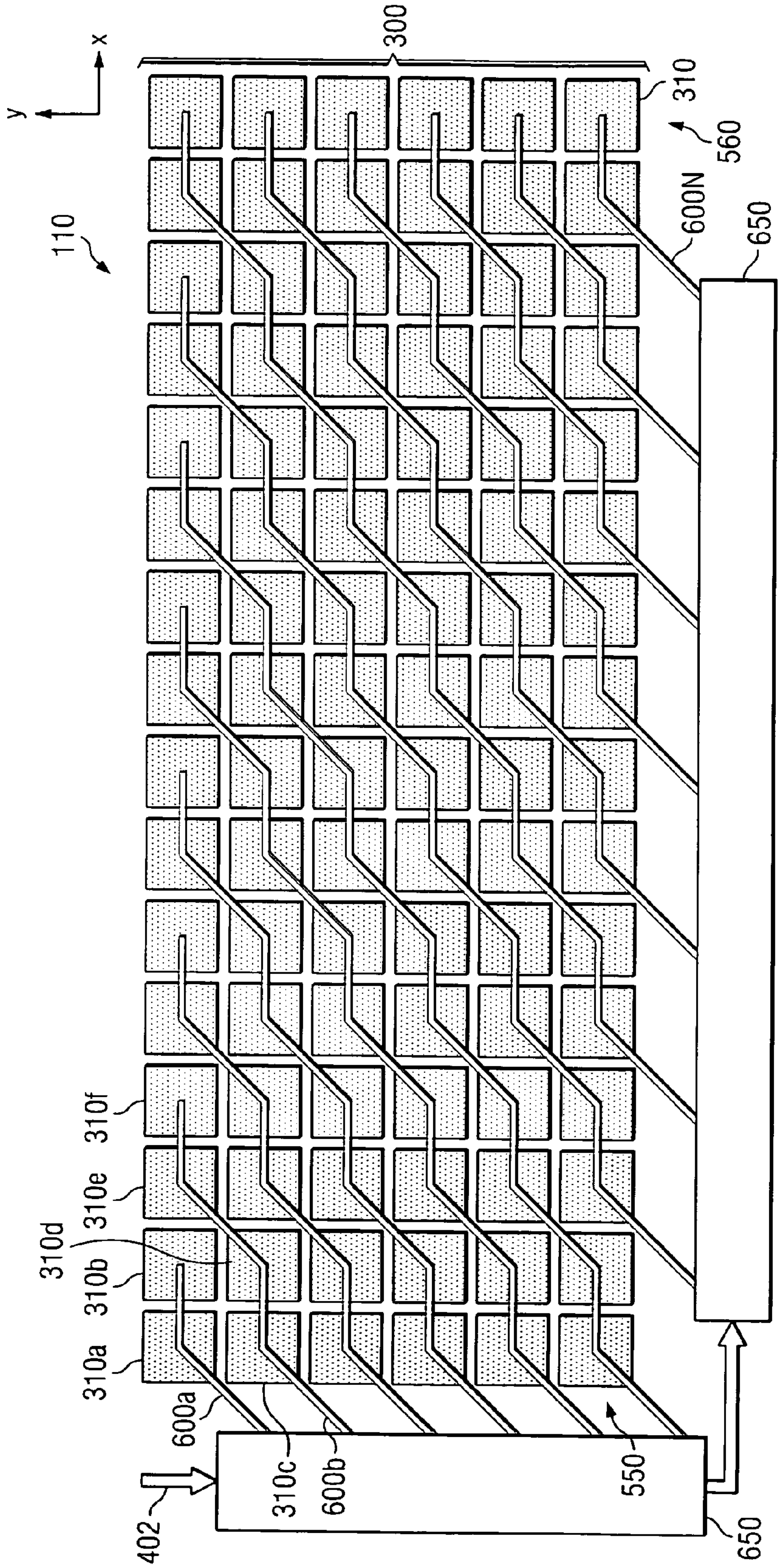
FIG. 6 is a representation of a strobe line configuration of the spatial light modulator, in accordance with embodiments of the present invention.

Therefore, in accordance with embodiments of the present invention, an improved strobe line configuration is shown in FIG. 6. The strobe line configuration shown in FIG. 6 can be used with the SLM 110 configuration shown in FIG. 5. In FIG. 6, the strobe lines 600*a* . . . 600N (collectively referred to herein as 600) extend generally diagonally across the array 300 of light modulation elements 310 to shorten the length of the strobe lines 600. As used herein, the term "diagonal" means passing through at least two non-orthogonal light modulation elements 310, where "non-orthogonal" means positioned in different rows and different columns of the array 300. Diagonally-extending strobe lines 600 increase the operational frequency of the strobe signal, reduce clock skew and limit the scope of damage arising from strobe line failure to a portion of the array 300. Each strobe line 600 is electrically coupled to at least two light modulation elements 310 that are non-orthogonally positioned within the array 300 with respect to one another. Those of the light modulation elements 310 coupled to each of the strobe lines 600 constitute a set of the light modulation elements 310. It should be understood that although the strobe lines 600*a* . . . 600N are shown coupled to the light modulation elements 310 with electrical conductors throughout the Figures, the strobe lines 600*a* . . . 600N could alternatively be coupled to the light modulation elements 310 by intervening circuits, such as buffers, as described in co-pending and commonly assigned U.S. application for patent Ser. No. 10/810,067.

In one embodiment, the strobe lines are alternately coupled to orthogonally-adjacent and diagonally-adjacent light modulation elements 310 to reduce the number of strobe lines 600 compared with strobe lines that run purely diagonally. For example, as shown in FIG. 6, the strobe lines 600 are alternately coupled to two horizontally-adjacent, i.e., adjacent in the x-direction, and two diagonally-adjacent light modulation elements 310. Alternatively, the number of horizontally-adjacent and/or diagonally-adjacent light modulation elements 310 may be greater than two. In another example in which the data is shifted between columns of the array 300, the strobe lines 600 are alternately coupled to two or more vertically adjacent, i.e., adjacent in the y-direction, and two or more diagonally-adjacent light modulation elements 310. In another embodiment, the strobe lines 600 are coupled to only diagonally-adjacent light modulation elements 310. Such a connection minimizes the length of the strobe lines. It should be understood that numerous strobe line 600 configurations that connect to diagonally positioned light modulation elements are possible, and the present invention is not limited to any particular strobe line 600 configuration.

In the example shown in FIG. 6, strobe line 600*a* provides a strobe signal to light modulation elements 310*a* and 310*b* that are horizontally-adjacent one another, i.e., that are adjacent in the x-direction, to shift the data out of light modulation elements 310*a* and 310*b*, and strobe line 600*b* provides a strobe signal to light modulation elements 310*c–f* that are alternately horizontally-adjacent and diagonally-adjacent. Light modulation elements 310*c* and 310*d* are horizontally-adjacent and are vertically adjacent, i.e., adjacent in the y-direction, to light modulation elements 310*a* and 310*b*, respectively. Therefore, a strobe signal distributed by strobe line 600*b* causes data to be shifted out of light modulation elements 310*c* and 310*d* and into light modulation elements 310*a* and 310*b*, respectively. Light modulation element 310*e* is diagonally-adjacent light modulation element 310*d* and horizontally-adjacent light modulation element 310*f*. The strobe signal distributed by strobe line 600*b* causes data to be shifted out of light modulation elements 310*e* and 310*f*.

Each strobe line 600 is sequentially accessed using a shift register 650 that implements a digital delay line using a ripple clock to control the timing of the data shifting between the light modulation elements. For example, when a strobe signal 402 is sent from the timing circuit (214, shown in FIG. 2), the strobe signal 402 is input to the shift register 650 and is clocked through the shift register 650 to sequentially provide the strobe signal 402 to each of the strobe lines 600, starting with a strobe line 600*a* that shifts data out of light modulation elements 310*a* and 310*b* and ending with a strobe line 600N that shifts data into the light modulation elements 310 connected to strobe line 600N. In one embodiment, the strobe lines 600 have a consistent pattern across the entire area of the array 300.

Figure 7:
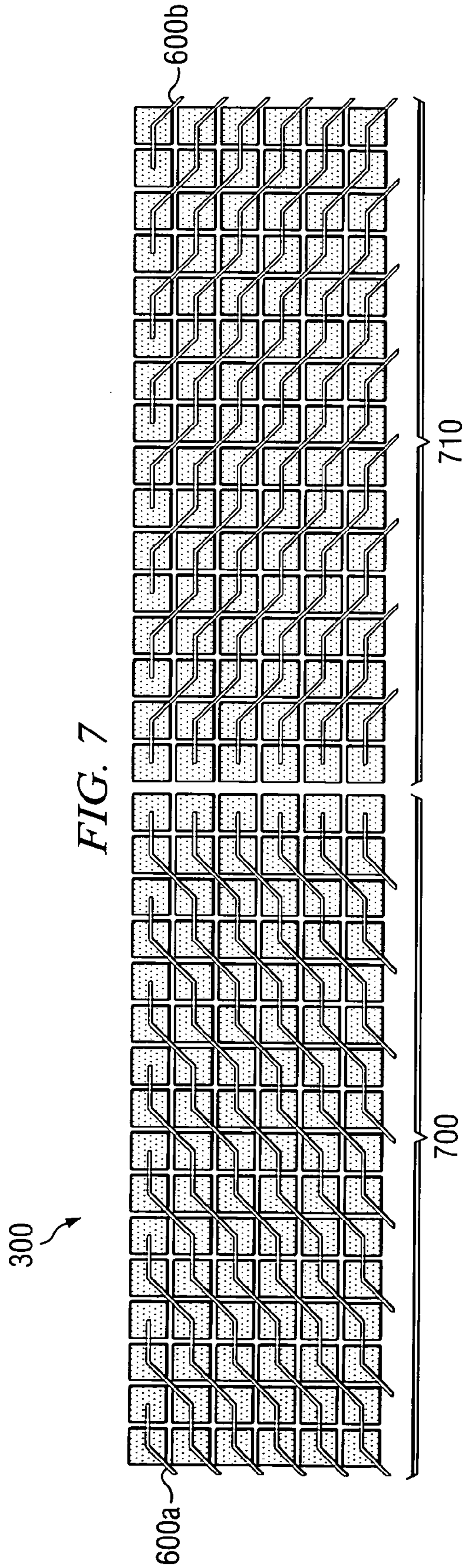
FIG. 7 is representation of a strobe line configuration of the spatial light modulator, in accordance with other embodiments of the present invention.

In other embodiments, as shown in FIG. 7, the strobe lines 600 are arranged in a first pattern across a first portion 700 of the array 300 and in a second pattern across a second portion 710 of the array 300. For example, in FIG. 7, the strobe lines 600 are arranged in two patterns that mirror one another, and the mirroring strobe lines 600*a* and 600*b* in each portion 700 and 710 of the array 300, respectively, can be accessed simultaneously to increase the operational frequency of the strobe lines 600 of spatial light modulator 110.

Figure 8:
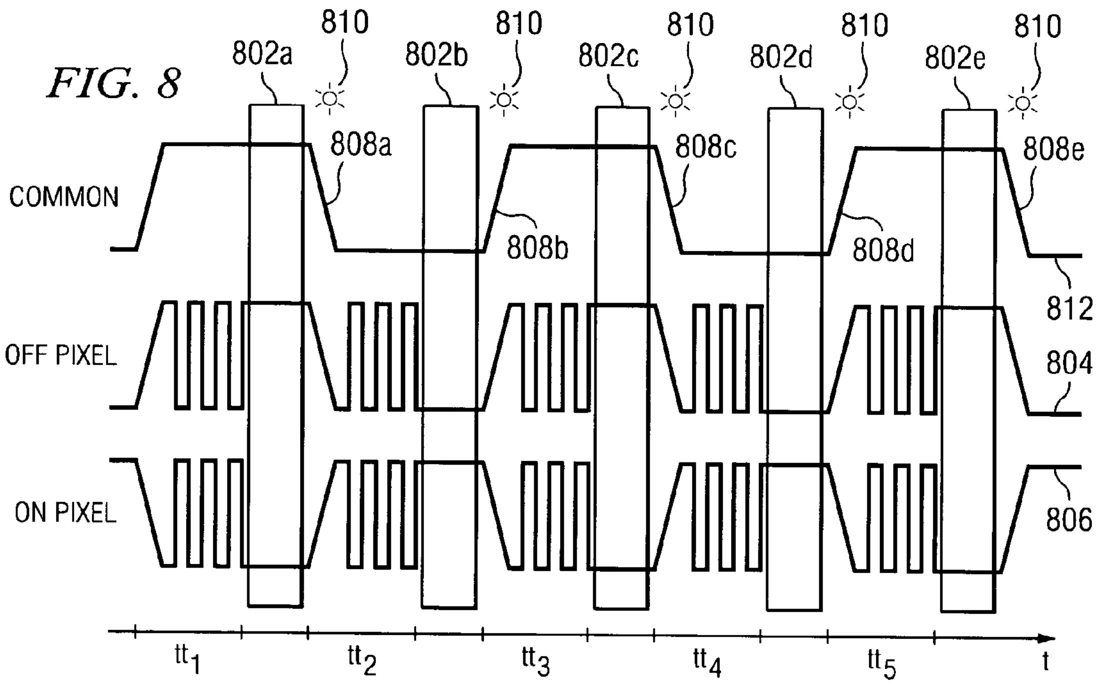
FIG. 8 illustrates an exemplary substrate exposure timing sequence.

FIG. 8 illustrates an exemplary substrate exposure timing sequence using data shifting. FIG. 8 shows a series of liquid crystal (LC) settling intervals 802*a*–802*e* (collectively 802) during which the LC material settles between exposures. At the end of each LC settling interval 802, the laser is flashed (represented by 810). Between consecutive LC settling intervals 802, there are transition time intervals $tt_1$–$tt_5$. During each of the transition time intervals $tt_1$–$tt_5$, data is moved between the memory elements within the SLM in preparation for the next exposure. The timing circuit 214 (shown in FIG. 2) can be utilized to apply the strobe signals to the strobe lines 600 (shown in FIG. 6) to drive the data propagation.

The electrical state of a common electrode signal 812 alternates between consecutive ones of time intervals $tt_1$–$tt_5$. Transitions 808*a*–808*e* of the common electrode signal 812 occur during the time intervals $tt_1$–$tt_5$ after the laser flashes, shown at 810. In FIG. 8, two exemplary pixel electrode signals 804 and 806 are shown, where pixel electrode signal 804 is illustrative of that of an ON liquid crystal element and pixel electrode signal 806 is illustrative of that of an OFF liquid crystal element. At each laser flash 810, the pixel electrode signal 804 on the pixel electrode has the same potential as the common electrode, and the pixel electrode signal 806 on the pixel electrode has the opposite potential as the common electrode. During the transition time intervals $tt_1$–$tt_5$, data inversions are performed as data is shifting through the memory array to maintain DC balance of the liquid crystal elements. In one embodiment, the data is shifted between the memory elements of the light modulation elements during the transition time intervals $tt_1$–$tt_5$ in about 60 microseconds, which allows 940 microseconds of a one millisecond duty cycle for the liquid crystal material to respond to the electric field applied between the pixel electrode and the common electrode. A twenty-nanosecond (20 ns) flash of the laser 810 occurs at the end of each of the LC settling intervals 802 after the liquid crystal material has transitioned. It should be understood that other timings can be established to increase or decrease the LC settling intervals 802 and data shifting rates based on the transition rate of the liquid crystal material and speed of the substrate moving with respect to the spatial light modulator.

Figure 9:
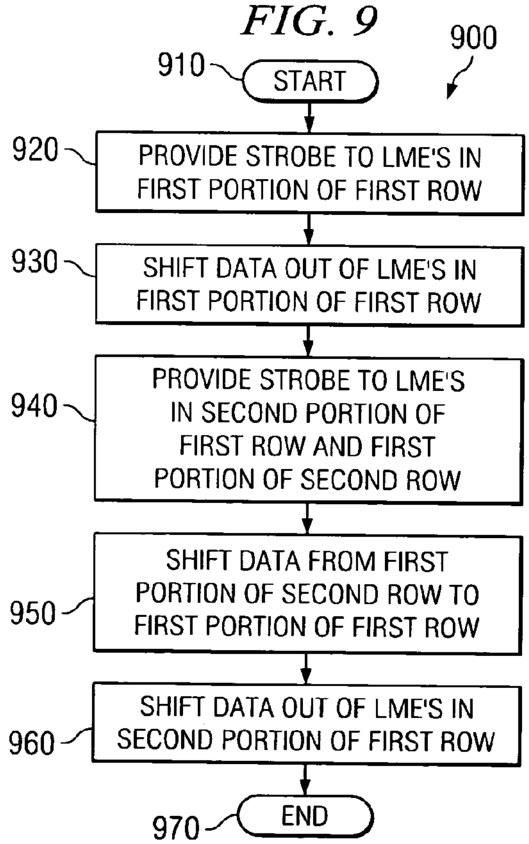
FIG. 9 is a flow chart illustrating an exemplary process to provide strobe signals to light modulation elements within a spatial light modulator to shift data between light modulation elements.

FIG. 9 is a flow chart illustrating an exemplary process 900 to provide strobe signals to light modulation elements within a spatial light modulator to shift data between light modulation elements. The process starts at block 910. At block 920, a first strobe signal is applied to the light modulation elements in a first portion of a first row of an array of light modulation elements to trigger the shifting of data out of the light modulation elements in the first portion of the first row at block 930. At block 940, a second strobe signal is applied to the light modulation elements in a second portion of the first row, adjacent the first portion in the first row and a first portion of a second row, adjacent the first portion in the first row. At block 950, the second strobe signal triggers the light modulation elements in the first portion of the second row to shift data from the light modulation elements in the first portion of the second row to the light modulation elements in the first portion of the first row. At block 960, the second strobe signal also triggers the light modulation elements in the second portion of the first row to shift data out of the light modulation elements in the second portion of the first row. The process ends at block 970.

Figure 10:
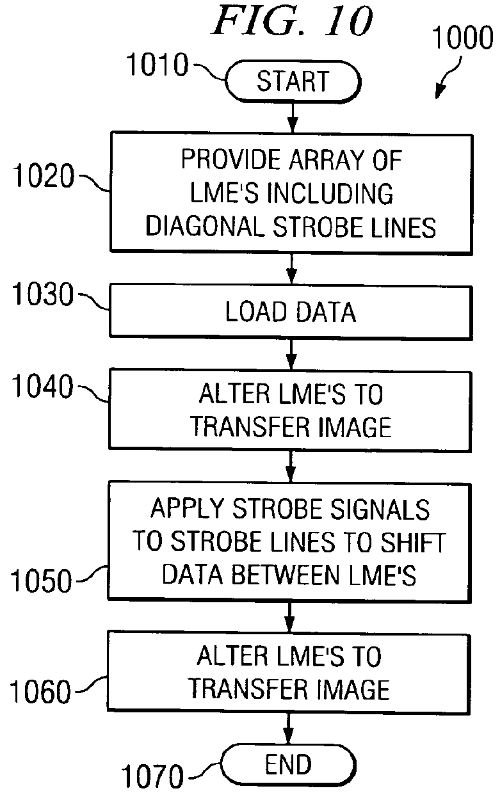
FIG. 10 is a flow chart illustrating an exemplary process for shifting data within a spatial light modulator to dynamically photolithographically transfer an image onto a substrate.

FIG. 10 is a flow chart illustrating an exemplary process 1000 for shifting data within a spatial light modulator to dynamically photolithographically transfer an image onto a substrate. The photolithography process starts at block 1010. At block 1020, an array of light modulation elements is provided that includes strobe lines electrically coupled to respective sets of light modulation elements. At least one of the sets includes light modulation elements that are positioned diagonally adjacent one another in the array. For example, each set can include at least respective two light modulation elements positioned diagonally-adjacent one another in the array. As another example, each set of light modulation elements can include both diagonally-adjacent and orthogonally-adjacent light modulation elements to shift the data bi-directionally between rows and/or columns of the array.

At block 1030, data representing an image is loaded into light modulation elements within a spatial light modulator. At block 1040, the light modulation elements are altered in response to the data loaded thereinto. The altered light modulation elements are illuminated to direct an illumination pattern onto the substrate. At block 1050, strobe signals are provided to the strobe lines to shift the data between the light modulation elements. At block 1060, the light modulation elements are altered again in response to the data moved into them. The process ends at block 1070.

The innovative concepts described in the present application can be modified and varied over a wide rage of applications. Accordingly, the scope of patented subject matter should not be limited to any of the specific exemplary teachings discussed, but is instead defined by the following claims.

I claim:

1. An electronic circuit, comprising:

circuit elements arranged in an array, said circuit elements being alterable in response to data stored therein and configured to shift data therebetween; and a strobe line electrically coupled to ones of said circuit elements constituting a set to provide thereto a strobe signal to cause said ones of said circuit elements in said set to shift the data to ones of said circuit elements outside said set, said set comprising at least two of said circuit elements positioned diagonally adjacent one another in the array.

2. The electronic circuit of claim 1, wherein said set additionally comprises ones of said circuit elements positioned orthogonally-adjacent in the array and ones of said circuit elements positioned diagonally-adjacent in the array.

3. The electronic circuit of claim 2, wherein said ones of said circuit elements positioned orthogonally-adjacent in the array number more than two.

4. The electronic circuit of claim 2, wherein said strobe line is electrically coupled to a first one and a second one of said circuit elements, said first one and said second one of said circuit elements being horizontally-adjacent.

5. The electronic circuit of claim 4, wherein said strobe line is additionally electrically coupled to a third one of said circuit elements diagonally-adjacent said second one of said circuit elements.

6. The electronic circuit of claim 5, wherein said strobe line is additionally electrically coupled to a fourth one of said circuit elements horizontally-adjacent said third one of said circuit elements.

7. The electronic circuit of claim 1, wherein said circuit elements are arranged in rows and columns.

8. The electronic circuit of claim 7, wherein said circuit elements are configured to shift data bi-directionally between orthogonally-located ones of said circuit elements.

9. The electronic circuit of claim 1, further comprising:

a buffer connected to at least one end of the array of said circuit elements to provide the data to said circuit elements.

10. The electronic circuit of claim 1, wherein said circuit elements are light modulation elements, said light modulation elements including:

memory elements configured to store the data and shift the data therebetween; and pixel controllers configured to alter the state of respective ones of said light modulation elements in response to the data stored in respective ones of the memory elements.

11. The electronic circuit of claim 10, wherein each of said memory elements further includes an output node electrically coupled to said respective pixel controller and to an input node of an additional one of said memory elements.

12. The electronic circuit of claim 11, wherein said light modulation elements comprise liquid crystal material.

13. The electronic circuit of claim 12, wherein:

the pixel controllers include pixel electrodes connected to receive the data stored in said respective memory elements, and said light modulation elements collectively comprise a common electrode connected to receive a common electrode signal.

14. The electronic circuit of claim 10, wherein:

said light modulation elements additionally include micromirrors, and the pixel controllers comprise electromechanical devices configured to control the state of said respective ones of said micromirrors in response to the data stored in respective ones of said memory elements.

15. The electronic circuit of claim 1, wherein:

said electronic circuit additionally comprises additional strobe lines; and said strobe lines are configured in a first pattern covering a first portion of said circuit elements and in a second pattern covering a second portion of said circuit elements, the second pattern mirroring the first pattern.

16. The electronic circuit of claim 1, wherein said electronic circuit additionally comprises:

additional strobe lines; and a shift register electrically connected to said strobe lines to apply strobe signals sequentially thereto.

17. The electronic circuit of claim 16, wherein said shift register implements a ripple clock.

18. A method for performing photolithography, said method comprising:

providing an array of light modulation elements, said array comprising strobe lines electrically coupled to respective sets of said light modulation elements, at least one of said sets comprising ones of the light modulation elements positioned diagonally adjacent one another in said array;

loading data representing an image into said array;

altering ones of the light modulation elements in response to said data to transfer an instance of the image onto a substrate;

applying strobe signals to said strobe lines to shift said data between said light modulation elements;

altering ones of the light modulation elements in response to said data shifted thereinto to transfer another instance of the image onto the substrate.

19. The method of claim 18, wherein each said altering further comprises:

applying a voltage in response to said data to the change optical characteristics of the light modulation elements.

20. The method of claim 18, wherein said applying further comprises:

utilizing a ripple clock to control the timing of said applying.

21. The method of claim 18, wherein said at least one of said sets additionally comprises ones of said light modulation elements positioned orthogonally-adjacent in said array and ones of said light modulation elements positioned diagonally-adjacent in said array.

22. The method of claim 18, wherein said light modulation elements are arranged in said array in rows and columns, and wherein said applying further comprises:

applying a first strobe signal to first ones of said light modulation elements in a first row;

in response to said first strobe signal, shifting the data out of said first ones of said light modulation elements in said first row;

applying a second strobe signal to second ones of said light modulation elements in said first row and to first ones of said light modulation elements in a second row, adjacent said first ones of said light modulation elements in said first row;

in response to said second strobe signal, shifting the data from said first ones of said light modulation elements in said second row to said first ones of said light modulation elements in said first row; and in response to said second strobe signal, shifting the data out of said second ones of said light modulation elements in said first row.

* * * * *